United States Patent
Melanson et al.

(10) Patent No.: US 12,362,645 B2
(45) Date of Patent: Jul. 15, 2025

(54) POWER CONVERSION BY A PHASE-CONTROLLED CASCADE OF AN INDUCTOR-BASED POWER SUPPLY AND A CHARGE PUMP

(71) Applicant: CIRRUS LOGIC INTERNATIONAL SEMICONDUCTOR LTD., Edinburgh (GB)

(72) Inventors: John L Melanson, Austin, TX (US); Eric J. King, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 236 days.

(21) Appl. No.: 18/358,263

(22) Filed: Jul. 25, 2023

(65) Prior Publication Data

US 2025/0038642 A1    Jan. 30, 2025

(51) Int. Cl.
H02M 1/00       (2007.01)
H02M 3/07       (2006.01)
H03F 3/21       (2006.01)
H04R 3/00       (2006.01)

(52) U.S. Cl.
CPC ......... *H02M 1/0054* (2021.05); *H02M 1/007* (2021.05); *H02M 3/07* (2013.01); *H04R 3/00* (2013.01); *H03F 3/21* (2013.01); *H03F 2200/03* (2013.01)

(58) Field of Classification Search
CPC ...... H02M 1/0054; H02M 1/007; H02M 3/07; H04R 3/00; H03F 3/21
USPC .................... 381/120, 121; 330/260; 379/395
See application file for complete search history.

(56) References Cited

U.S. PATENT DOCUMENTS

| | | | |
|---|---|---|---|
| 9,013,229 B2 | 4/2015 | Rahman et al. | |
| 9,225,239 B2 | 12/2015 | Williams | |
| 11,316,424 B2 | 4/2022 | Giuliano | |
| 2015/0048743 A1* | 2/2015 | Liao | G09G 3/3696 315/161 |
| 2018/0337594 A1 | 11/2018 | Zhang et al. | |
| 2022/0337170 A1 | 10/2022 | Giuliano et al. | |

FOREIGN PATENT DOCUMENTS

WO    WO-2017161368 A1    9/2017

OTHER PUBLICATIONS

Combined Search and Examination Report mailed Oct. 31, 2024 in application GB2408289.2, UK Intellectual Property Office.

* cited by examiner

*Primary Examiner* — Thjuan K Addy
(74) *Attorney, Agent, or Firm* — Mitch Harris, Atty at Law, LLC; Andrew M. Harris

(57) ABSTRACT

A cascaded switched power converter provides a wide voltage conversion ratio and improved efficiency ins systems such as power supplies and amplifiers. A switched-capacitor charge pump circuit is operated by one or more first clock signals and is coupled in cascade with an inductor-based power supply circuit according to one or more second clock signals. A control circuit that generates clock signals so that the one or more second clock signals have a phase offset with respect to the one or more first clock signals that is set to adjust a conversion ratio of the cascaded combination of the switched-capacitor charge pump circuit and the inductor-based power supply circuit. The inductor of the inductor-based power supply circuit may be an inductive load, such as a speaker, and the phase offset may be modulated according to an audio signal to provide audio amplification.

31 Claims, 9 Drawing Sheets

POWER CONVERSION BY A PHASE-CONTROLLED CASCADE OF AN INDUCTOR-BASED POWER SUPPLY AND A CHARGE PUMP

BACKGROUND

1. Field of Disclosure

The field of representative embodiments of this disclosure relates to power conversion circuits, systems and methods such as power supplies, amplifiers, and motor drivers, and in particular to a cascade of inductor-based and charge pump power conversion circuits.

2. Background

Inductor-based switched-power circuits are commonly used in power supplies and amplification systems due to high power efficiency and reduced magnetic component weight and size. By switching current at a frequency greater than the frequencies to be reproduced by an amplifier, or by switching energy generally, in the case of switching power supplies, the size of magnetic components is reduced and losses required by linear circuit operation are eliminated. However, there are limitations on the input voltage to output voltage ratio in topologies such as buck converters, in which the maximum output voltage may only approach half of the input voltage, or boost converters, in which the output voltage cannot be less than the input voltage.

In order to accommodate a greater range of input-to-output voltage ratio, a switched-power circuit may be cascaded with another circuit having greater flexibility in setting the voltage conversion range, such as a charge pump. However, the efficiency of a charge pump is generally limited by the switching losses ($I^2R$ losses) in the switching transistors. One way in which efficiency of a charge pump stage has been improved is by using a pair of charge pumps operating in parallel with complementary switching phases. However, there is still a limitation on the particular output voltages that can be produced with a given input voltage, since the charge pump stage typically has a fixed ratio.

Therefore, it would be advantageous to provide a cascaded switched-power converter having a wider range of voltage conversion ratio than a typical cascaded converter having an inductor-based power supply and a charge pump. It would further be desirable to provide such a cascaded switched-power converter with improved efficiency.

SUMMARY

The objective of providing a switched-power converter having a wide range of voltage conversion ratio and improved efficiency is provided in a switched-power converter, integrated circuits including the switched-power converter, and their methods of operation.

In some embodiments, the circuit is a circuit for delivering power to a load. The circuit includes a first terminal for receiving an input voltage or current, a switched-capacitor charge pump circuit operated by one or more first clock signals, and including at least two storage capacitors, and an inductor-based power supply circuit. The switched-capacitor charge pump circuit is coupled in cascade with the inductor-based power supply circuit between the first terminal and a second terminal according to one or more second clock signals. The circuit also includes a control circuit that generates the one or more first clock signals and the one or more second clock signals so that the one or more second clock signals have a phase offset with respect to the one or more first clock signals that is set to adjust a conversion ratio of the cascaded combination of the switched-capacitor charge pump circuit and the inductor-based power supply circuit.

In other embodiments, the circuit is a circuit for delivering power to an inductive load, and includes a first terminal for receiving an input voltage or current, a switched-capacitor charge pump circuit operated by one or more first clock signals, including at least two storage capacitors, and at least two switches respectively controlled by separate phases of a second clock signal to apply current in alternation from the at least two storage capacitors of the switched-capacitor charge pump circuit to the inductive load. The circuit also includes a control circuit that generates the one or more first clock signals and the second clock signal so that the second clock signal has a phase offset with respect to the one or more first clock signals that is set to adjust a conversion ratio of the circuit.

The summary above is provided for brief explanation and does not restrict the scope of the claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

DETAILED DESCRIPTION OF ILLUSTRATIVE EMBODIMENT

The present disclosure encompasses systems, circuits and integrated circuits that include a switched-capacitor charge pump circuit operated by one or more first clock signals coupled in cascade with an inductor-based power supply circuit according to one or more second clock signals. A control circuit that generates clock signals so that the one or more second clock signals have a phase offset with respect to the one or more first clock signals that is set to adjust a conversion ratio of the cascaded combination of the switched-capacitor charge pump circuit and the inductor-based power supply circuit. The inductor of the inductor-based power supply circuit may be an inductive load, such as a speaker, and the phase offset may be modulated according to an audio signal to provide audio amplification. The cascaded circuit is bi-directional in some examples, and the inductor-based power supply circuit may either receive input power, converting the input to provide an output to the charge pump circuit, or may produce output power, receiving its input from the charge pump circuit. The direction of energy flow may be changed according to an operating mode, to, for example, draw energy from a battery and charge a battery at different times.

Figure 1A:
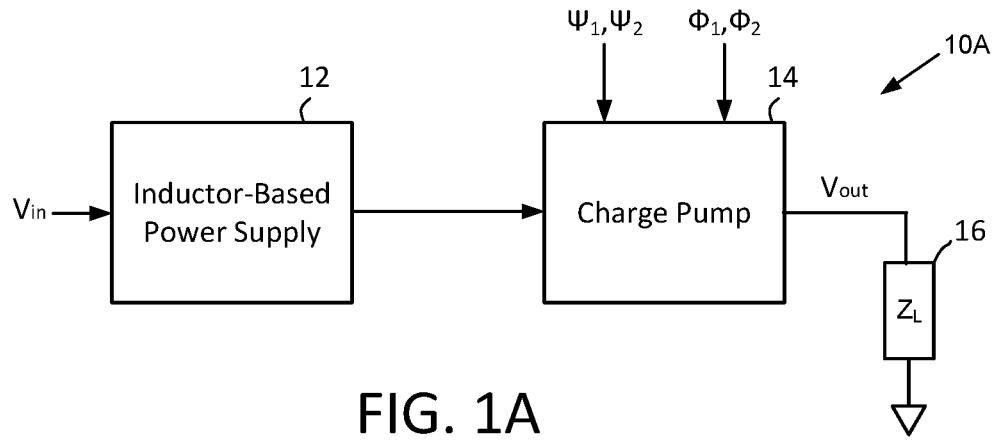
FIGS. 1A-1C are block diagrams illustrating different example switched-power conversion systems 10A-10C, respectively, in accordance with various embodiments of the disclosure.

Referring now to FIG. 1A, a block diagram of an example switched-power conversion system 10A is shown, in accordance with an embodiment of the disclosure. An inductor-based power supply 12 receives an input voltage $V_{in}$ at an input terminal, and generates an output that is provided to a charge pump 14, which, in turn, generates an output voltage $V_{out}$ across a load 16 represented by an impedance $Z_L$. Rather than operating as a typical charge pump from phases of a single clock, charge pump 14 is operated from phases $\Phi_1$, $\Phi_2$ and $\psi_1$, $\psi_2$ two different clocks $\Phi$ and $\psi$, and control of a phase relationship between clocks $\Phi$ and $\psi$ for provides the ability to operate the cascade of inductor-based power supply 12 and charge pump 14 that form switched-power conversion system 10A at a wider range of input voltage, including operating with input voltage $V_{in}$ at a voltage less than two times the value of output voltage $V_{out}$. The cascade of inductor-based power supply 12 and charge pump 14 is also operable in a reversed configuration, or a bi-directional configuration, as the operation of each of inductor-based power supply 12 and charge pump 14 is not tied to the direction of energy flow.

Figure 1B:
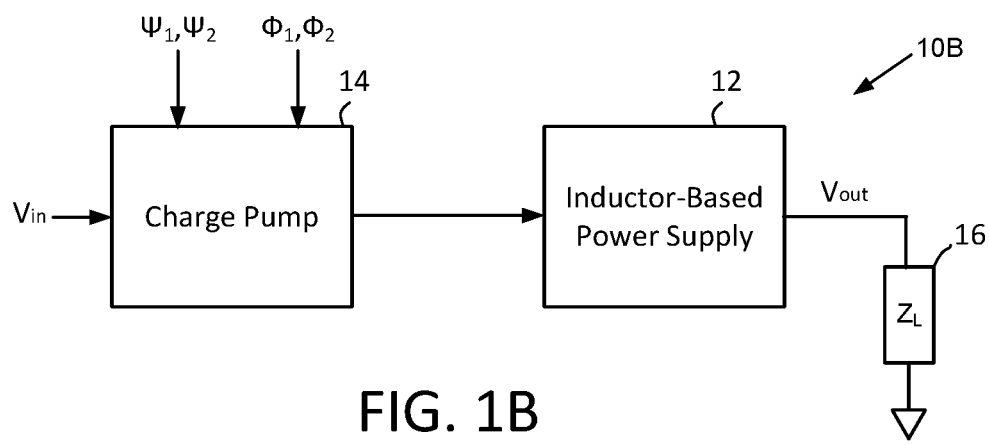
Figure 1C:
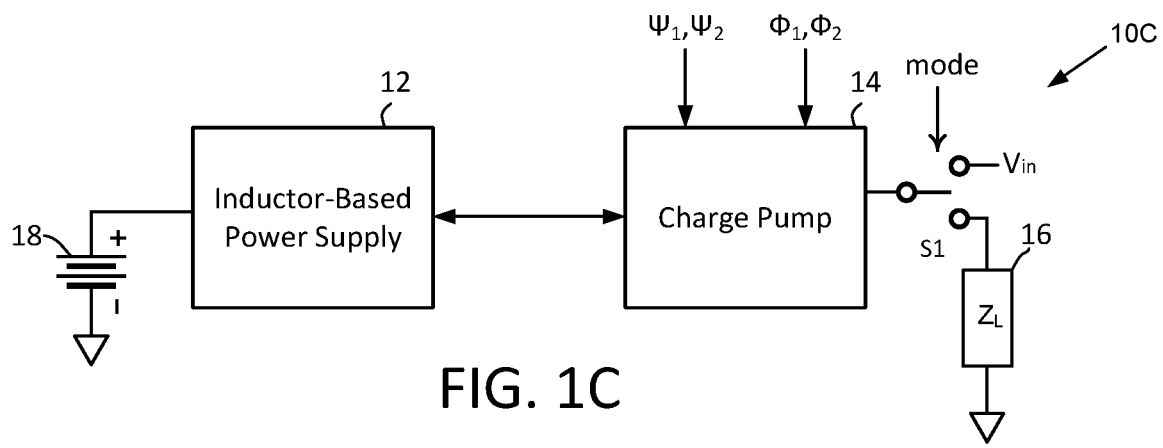

Referring now to FIG. 1B, a block diagram of an example switched-power conversion system 10B is shown, in accordance with an embodiment of the disclosure. In the depicted configuration, inductor-based power supply 12 receives an input from charge pump 14, which, in turn, receives input voltage $V_{in}$ at an input terminal and generates output voltage $V_{out}$ across load 16. Referring now to FIG. 1C, a block diagram of an example switched-power conversion system 10C is shown, in accordance with an embodiment of the disclosure. In the depicted configuration, inductor-based power supply 12 receives an input from a battery 18 and alternatively charges battery 18, depending on a state of an operating mode selection control signal mode, which operates a switch S1 that determines whether charge pump 14 provides an output to load 16 or receives input voltage $V_{in}$. In each of switched power conversion systems 10A-10C of FIGS. 1A-1C, respectively, the circuits implementing inductor-based power supply 12 and charge pump 14 may be identical, as illustrated in further detail below.

Figure 2A:
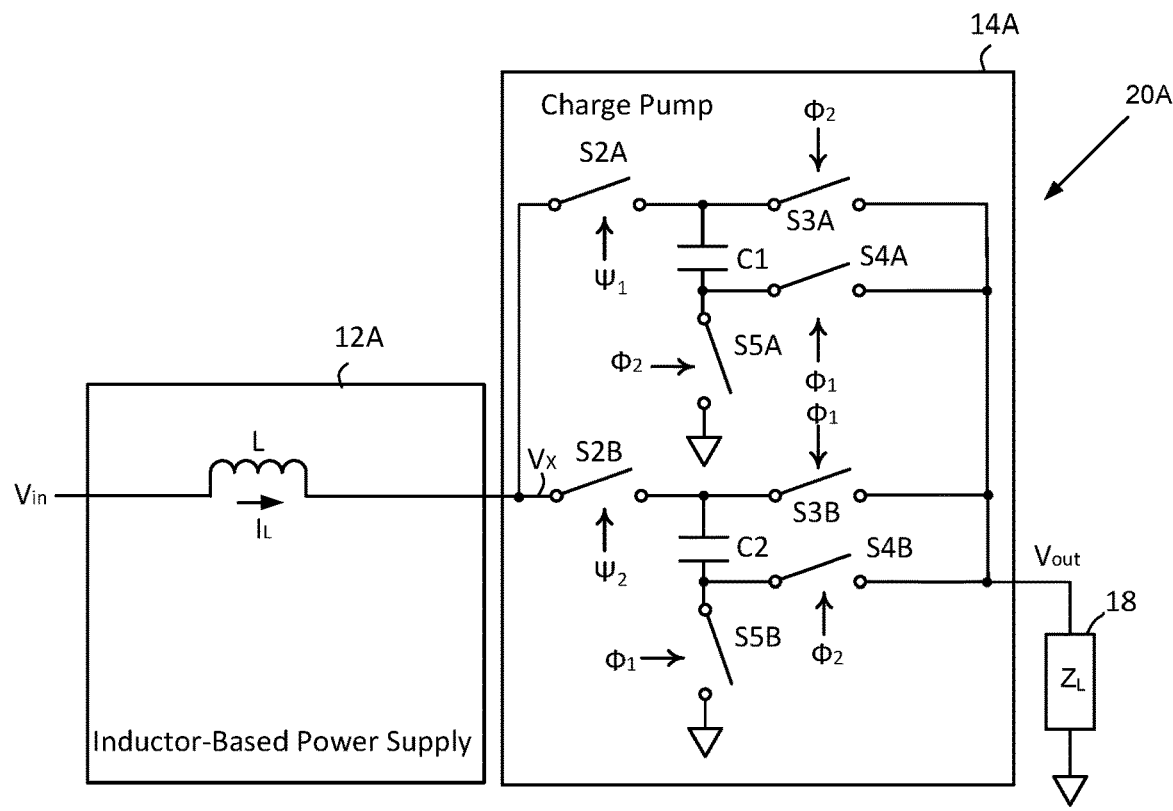
FIGS. 2A-2B are circuit diagrams illustrating example switched-power conversion circuits 20A and 20B, in accordance with embodiments of the disclosure.
Figure 2B:
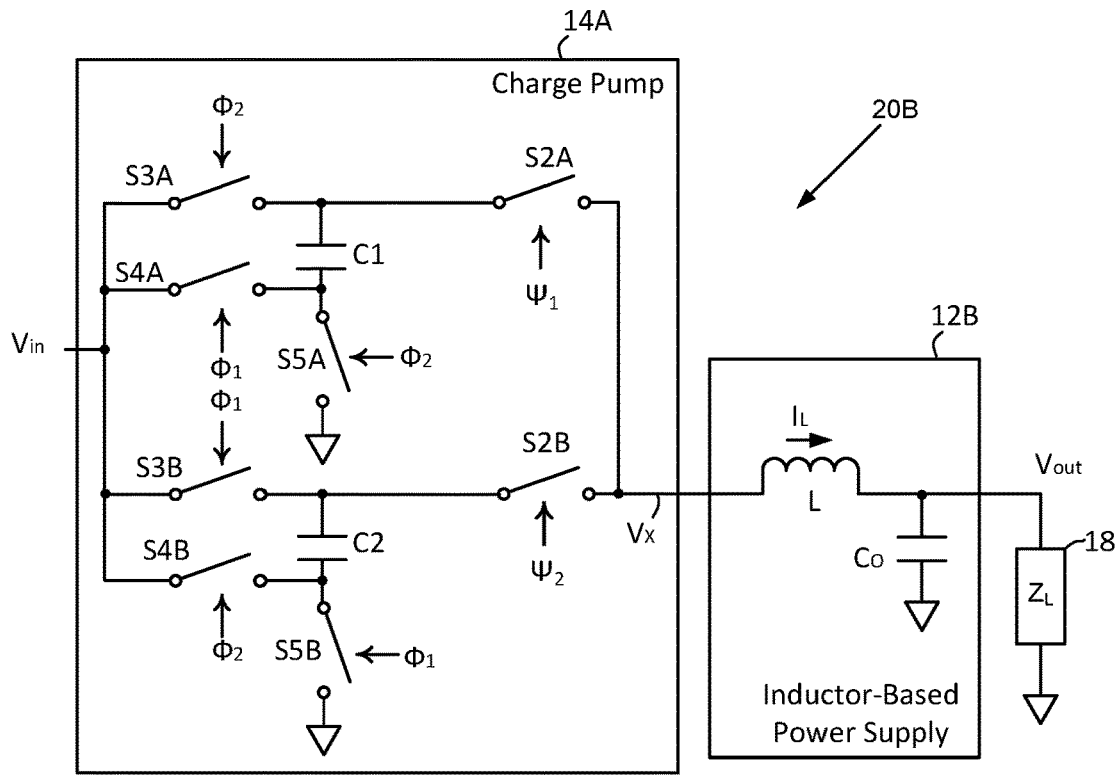

Referring now to FIG. 2A, a circuit diagram illustrating an example switched-power conversion circuit 20A is shown, in accordance with an embodiment of the disclosure. Example switched-power conversion circuit 20A may be used to implement example switched-power conversion system 10A of FIG. 1A and example switched-power conversion system 10C of FIG. 1C, as configured, with an inductor-based power supply 12A receiving input voltage $V_{in}$ cascaded with a charge pump circuit 14A to generate output voltage $V_{out}$ across load 18. Additionally, with reference to FIG. 2B, which shows another example switched-power conversion circuit 20B in accordance with an embodiment of the disclosure, and which may be used to implement switched-power conversion system 10B of FIG. 1B, as configured, the cascade of inductor-based power supply 12B and charge pump 14A is identical to that of the cascade of inductor-based power supply 12A and charge pump 14A, with the exception of an output filter capacitor $C_O$ included in charge pump circuit 14A, and which can effectively be presumed present at the source of input voltage $V_{in}$, making example switched-power conversion circuit 20A of FIG. 2A an identical dual of example switched-power conversion circuit 20B of FIG. 2B. Therefore, example switched-power conversion circuit 20A of FIG. 2A and example switched-power conversion circuit 20B of FIG. 2B are agnostic with respect to the direction of power flow, as demonstrated in example switched-power conversion system 10C of FIG. 1C, and further, the arrangement of battery 18, and the combination of switch S1 and load 16 in example switched-power conversion system 10C of FIG. 1C could also be interchanged, i.e., example switched-power conversion circuit 20B of FIG. 2B could be used to implement example switched-power conversion system 10C of FIG. 1C by interchanging the positions of inductor-based power supply 12 and charge pump 14.

In example switched-power conversion circuit 20A, inductor-based power supply 12A consists of an inductor L, but in accordance with other embodiments of the disclosure, may include switching devices that intermittently apply input voltage to a terminal of inductor L. Charge pump 14A is a dual charge pump implemented as a pair of 2:1 charge pump stages that generate an output voltage $V_{out}$ that is double the input voltage provided to charge their respective storage capacitors C1 and C2. In a first clock phase $\Phi_1$ of a first clock $\Phi$ in the charge pump formed by capacitor C2 and switches S3B, S4B and S5B, capacitor C2 is connected in parallel with load 18 by switches S3B and S5B, and receives an input current from inductor-based power supply 12A when a switch S2B is closed according to a second clock $\psi$ that alternates the application of the output of inductor-based power supply 12A between the individual charge pump stages in charge pump 14A, as will be described in further detail below. In a second clock phase $\Phi_2$ of first clock $\Phi$, capacitor C2 is connected in series between the input of charge pump circuit 14A and load 18 by switch S4B. Therefore, in second clock phase $\Phi_2$, the voltage stored on capacitor C2 is added to the input voltage received by charge pump circuit 14A, doubling that input voltage at load 18. Capacitor C1 and switches S3A, S4A and S5A form the other charge pump of the pair of dual charge pumps, and operate in an identical manner, except that the connection of phases $\Phi_1$, $\Phi_2$ of the first clock $\Phi$ are interchanged for switches S3A, S4A and S5A with respect to those of switches S3B, S4B and S5B. Therefore, charge pump circuit 14A consists of two 2:1 charge pump stages operating out of phase with each other, with respect to the charge pump operating clock, i.e., first clock $\Phi$, that controls whether each charge pump stage is in the charging or doubling condition.

Figure 3A:
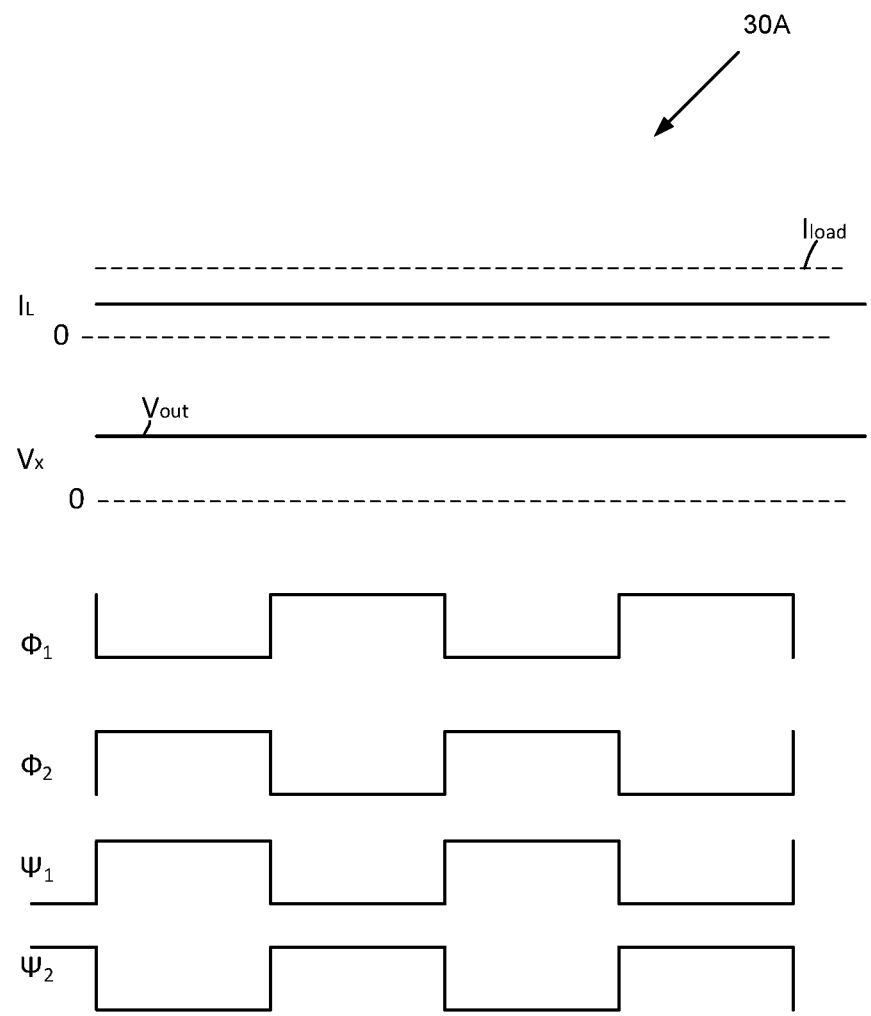
FIGS. 3A-3D are signal waveform diagrams 30A-30D, respectively, illustrating example signals within power conversion circuits as implemented in switched power conversion circuits 20A-20B of FIGS. 2A-2B, in accordance with an embodiment of the disclosure.
Figure 3B:
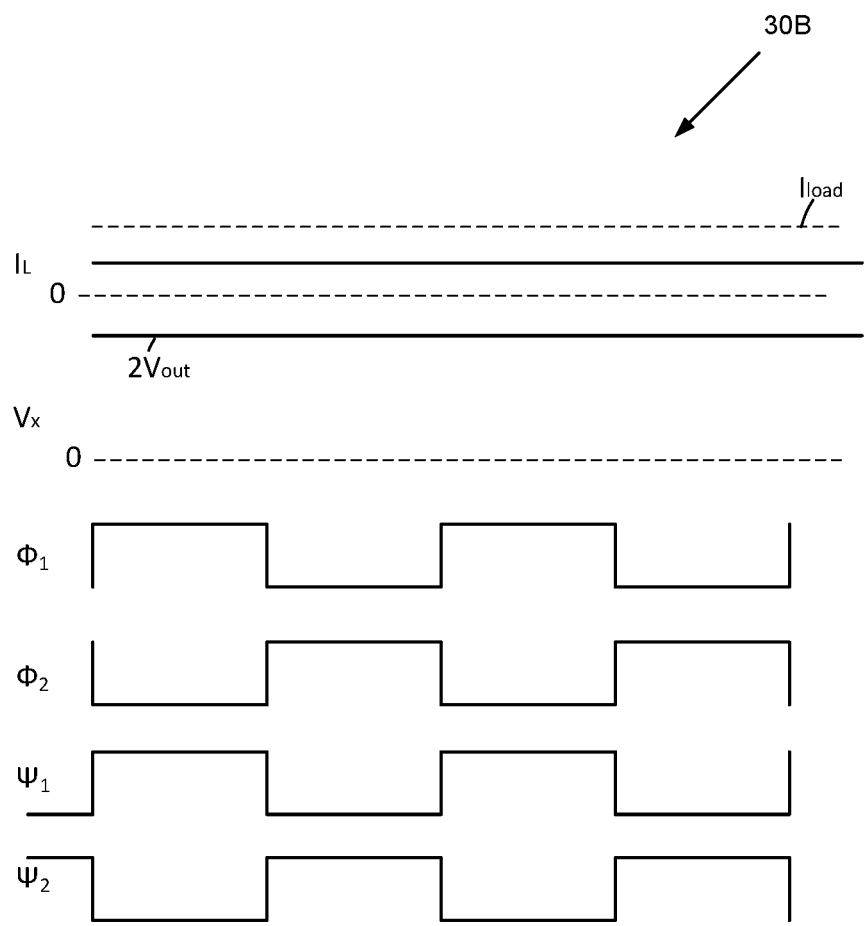

The second clock $\psi$ involved in the operation of charge pump circuit 14A, is a clock that controls application of current from inductor L of inductor-based power supply 12A. Second clock $\psi$ directs inductor current $I_L$ to one or the other of the pair of charge pump stages in charge pump circuit 14A through one of a pair of switches S2A and S2B, so that, at any time, there is always a continuous conduction path for inductor current $I_L$. Depending on the phase of second clock $\psi$ with respect to first clock $\Phi$, inductor current $I_L$ is directed to charge capacitors C1 and C2, either when capacitors C1 and C2 are configured in the 1:1 voltage relationship with respect to output voltage $V_{out}$ or the 2:1 voltage relationship with respect to output voltage $V_{out}$, or during both conditions, each during different portions of phases $\psi_1$, $\psi_2$ of second clock $\psi$. For the above reasons, switched-power conversion circuit 20A, and in general the other switched power conversion circuits described herein, differ from previous charge-pump based designs, because in those previous designs, the edges of second clock $\psi$ and the edges of first clock $\Phi$ coincide. In other words, both the phases of second clock $\psi$ and the phases of first clock $\Phi$ either coincide, or are inverted. In the instant disclosure, the controlled and non-zero phase difference between second clock $\psi$ and clock $\Phi$ allows for control of the voltage transfer ratio of charge pump circuit 14A, and thus switched-power conversion circuit 20A itself. For example, referring additionally to FIGS. 3A-3C, which show waveform diagrams 30A-30C, respectively, depicting different phase relationships between first clock $\Phi$ and second clock $\psi$. The assumptions in waveform diagrams 30A-30C are that the capacitance of capacitors C1 and C2 is large, and that charge pump 14A is in a steady-state condition. Signal waveform diagram 30A of FIG. 3A, illustrates operation of switched-power conversion circuit 20A (and also operation of switched-power conversion circuit 20B as noted above), when first clock $\Phi$ and second clock $\psi$ are in opposite phase, i.e., phase $\Phi_1$ of first clock $\Phi$ is identical to $\psi_2$ of second clock $\psi$, and similarly phase $\Phi_2$ of first clock $\Phi$ is identical to $\psi_1$ of second clock $\psi$. Since each of the stages of the dual charge pump in charge pump 14A are in the parallel-to-output configuration when their respective switch S2A, S2B that couples charge pump 14A to inductor-based power supply 12A is closed, i.e., due to switches S3A, S5A being closed during $\psi_1$ of second clock $\psi$ and switches S3B, S5B being closed during $\psi_2$ of second clock $\psi$, voltage $V_x$ is equal to output voltage $V_{out}$ and inductor current $I_L$ is equal to ½ of load current $I_{load}$. Signal waveform diagram 30B of FIG. 3B, illustrates operation of switched-power conversion circuit 20A (and also operation of switched-power conversion circuit 20B as noted above), when first clock $\Phi$ and second clock $\psi$ are in the same phase, i.e., phase $\Phi_1$ of first clock $\Phi$ is identical to $\psi_1$ of second clock $\psi$, and similarly phase $\Phi_2$ of first clock $\Phi$ is identical to $\psi_2$ of second clock $\psi$. Since each of the stages of the dual charge pump in charge pump 14A are in the series-to-output configuration when their respective switch S2A, S2B that couples charge pump 14A to inductor-based power supply 12A is closed, i.e., due to switch S4A being closed during $\psi_1$ of second clock $\psi$ and switch S4B being closed during $\psi_2$ of second clock $\psi$, voltage $V_x$ is equal to twice that of output voltage $V_{out}$ and inductor current $I_L$ is again equal to ½ of load current $I_{load}$.

Figure 3C:
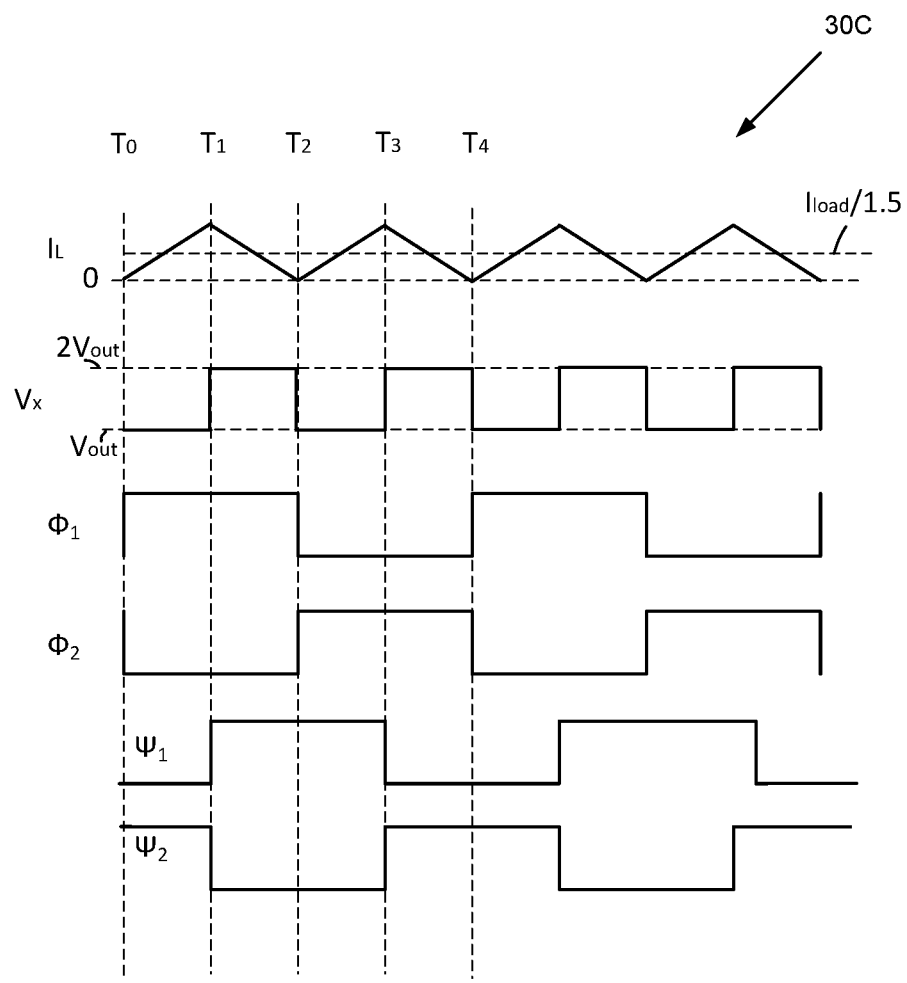
Figure 3D:
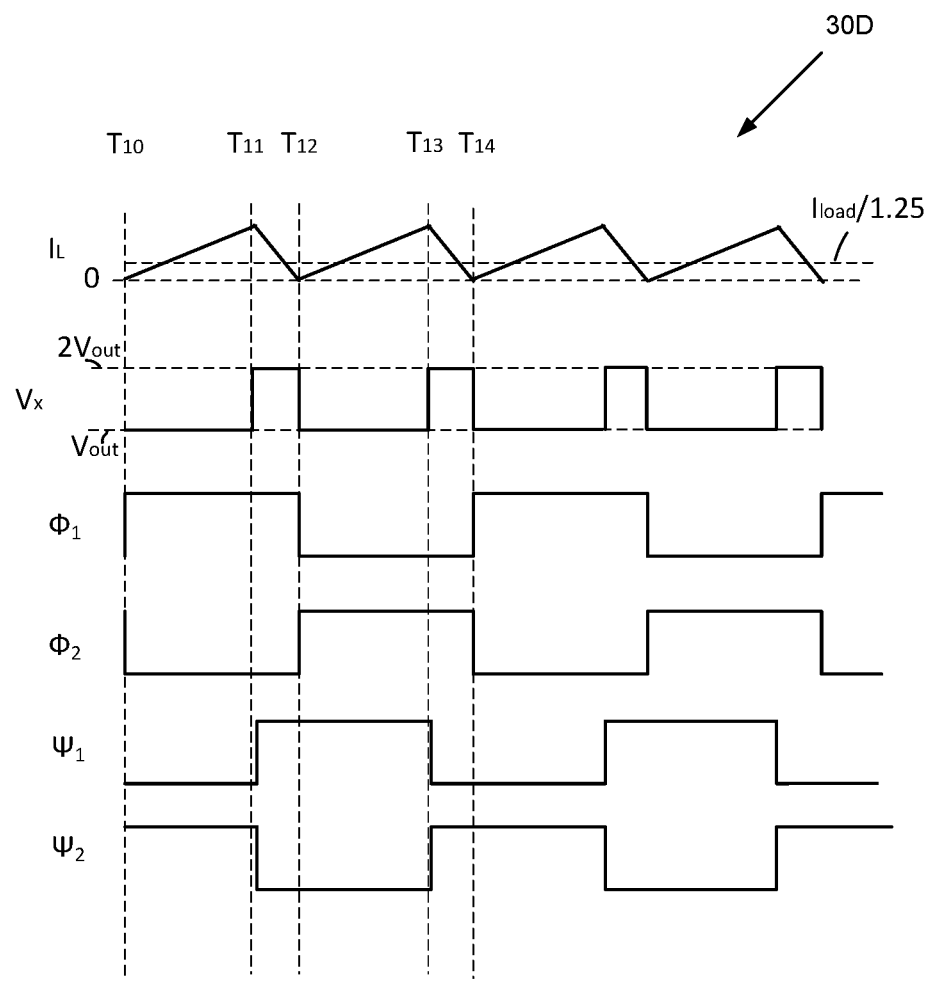

For all other phase relationships between first clock $\Phi$ and second clock $\psi$, a voltage between that of output voltage $V_{out}$ and $2V_{out}$ is produced, so that a continuous voltage conversion ratio between 1 and 2 may be selected/adjusted via control of the phase relationship between first clock $\Phi$ and second clock $\psi$. FIG. 3C depicts a signal waveform diagram 30C, in which the phase relationship between first clock $\Phi$ and second clock $\psi$ is 90 degrees. During the first two intervals depicted, i.e., between a time $T_0$ and a time $T_1$, then between time $T_1$ and a time $T_2$, first clock $\Phi$ is true and second clock $\psi$ toggles the connection to inductor-based power supply 12A between the two charge pump stages. Since the two stages are operated out-of-phase with respect to first clock $\Phi$, during the first interval between time $T_0$ and time $T_1$, capacitor C2 is coupled to inductor-based power supply 12A and is in a parallel configuration, so that voltage $V_x$ is equal to output voltage $V_{out}$, and inductor current $I_L$ increases. In the second interval between time $T_1$ and time $T_2$, capacitor C1 is coupled to inductor-based power supply 12A and is in a series configuration, so that voltage $V_x$ is equal to output voltage $2V_{out}$, and inductor current $I_L$ decreases. During a third interval between time $T_2$ and a time $T_3$, capacitor C1 remains coupled to inductor-based power supply 12A, but is now in a parallel configuration, since first clock $\Phi$ is now de-asserted. Voltage $V_x$ is equal to output voltage $V_{out}$, and inductor current $I_L$ increases. In a fourth interval between time $T_3$ and a time $T_4$, capacitor C2 is coupled to inductor-based power supply 12A and is in a series configuration, so that voltage $V_x$ is equal to output voltage $2V_{out}$, and inductor current $I_L$ decreases. The average value of $V_x$ is equal to $V_{in}$, and is $1.5V_{out}$, so that $V_{out}$ is ⅔ of $V_{IN}$. Different input voltages $V_{in}$ in a range from $V_{out}$ to $2V_{out}$ can be accommodated by shifting the phase relationship between first clock $\Phi$ is true and second clock $\psi$. Conversely, for a fixed value of input voltage $V_{in}$, output voltage $V_{out}$ may be adjusted in a range between $V_{in}/2$ and $V_{in}$. FIG. 3D depicts a signal waveform diagram 30D, in which the phase relationship between first clock $\Phi$ and second clock $\psi$ is 135 degrees. During the first two intervals depicted, i.e., between a time $T_{10}$ and a time $T_{11}$, then between time $T_{11}$ and a time $T_{12}$, first clock $\Phi$ is true and second clock $\psi$ toggles the connection to inductor-based power supply 12A between the two charge pump stages as in signal waveform diagram 30C of FIG. 3C, except that the interval from time $T_{10}$ to time $T_{11}$ is 75% of the period of inductor current $I_L$. The result is that the average value of $V_x$ is $1.25V_{out}$, which is again equal to $V_{in}$ so that $V_{out}=V_{in}/1.25=0.80$ $V_{in}$, and the average inductor current becomes $I_{LOAD}/1.25$.

Figure 4:
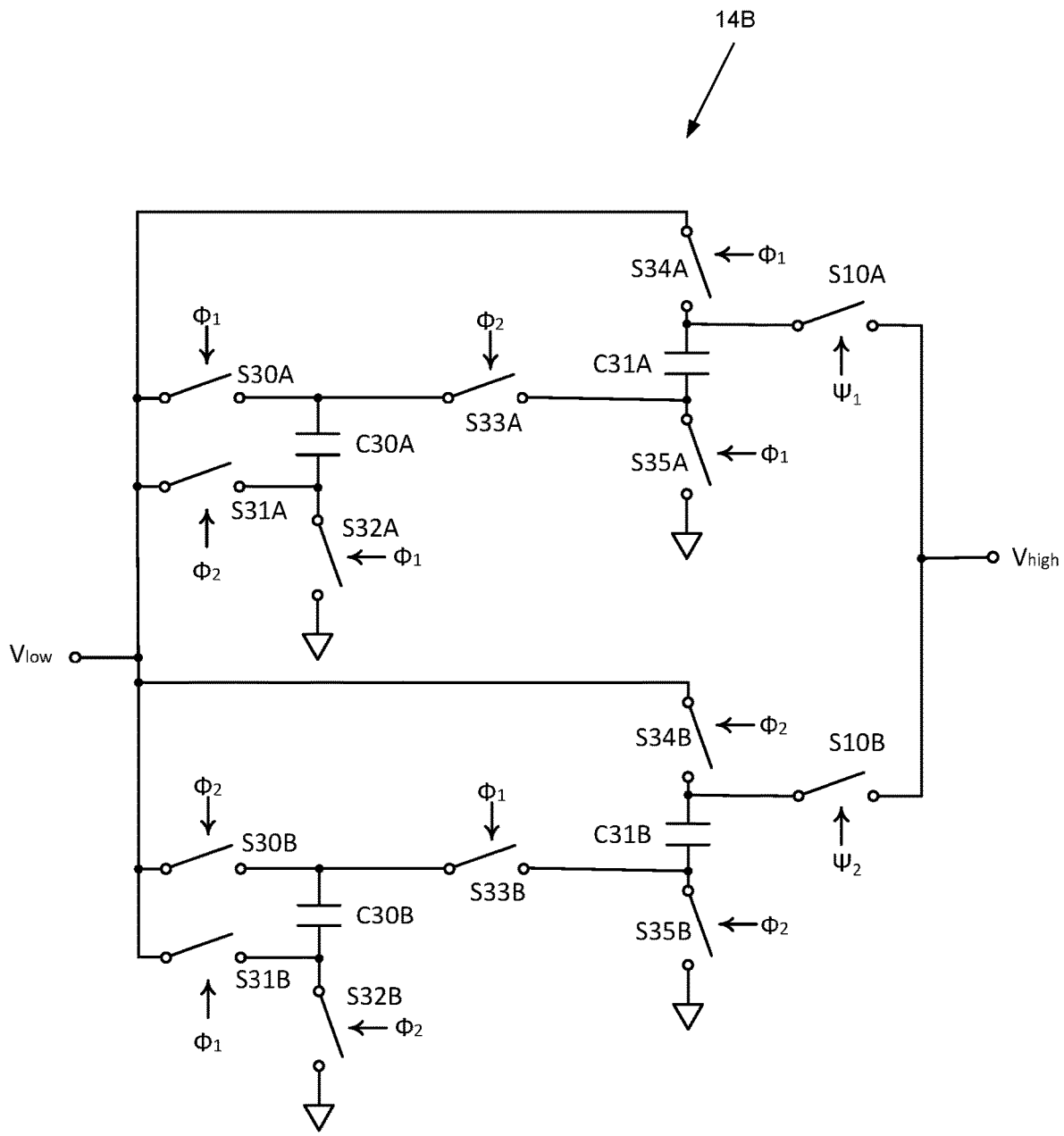
FIG. 4 is a schematic diagram of an example charge pump circuit 14B that may be used in place of charge pump circuit 14A in example power conversion circuits 20A and 20B of FIGS. 2A-2B, in accordance with an embodiment of the disclosure

Referring now to FIG. 4, a schematic diagram of an example charge pump circuit 14B that may be used in place of charge pump circuit 14A in example power conversion circuits 20A and 20B of FIGS. 2A-2B is shown, in accordance with an embodiment of the disclosure. Example charge pump circuit 14B, similar to charge pump circuit 14A in FIGS. 2A-2B, is a dual charge pump formed by a pair of charge pump stages, however both of the charge pump stages in charge pump circuit 14B implement a 3:1 voltage conversion ratio and include three storage capacitors. In first clock phase $\Phi_1$ of first clock $\Phi$, in the charge pump formed by capacitors C30A, C31A and switches S30A, S31A, S32A, S33A, S34A, and S35B, capacitors C30B and C31B are coupled in parallel with a terminal $V_{low}$, which is the lower-voltage input or output node, by pairs of switches S30A, S32A and S34A, S35A, respectively. The common coupling of capacitors C30A and C31A by switches S34A and S30A in first clock phase $\Phi_1$ of first clock $\Phi$, is also coupled to higher-voltage node $V_{high}$ by switch S10A during time intervals in which phase $\psi_1$ of second clock $\psi$ is asserted. In second clock phase $\Phi_2$ of first clock $\Phi$, capacitors C30A, C31A are coupled in series between lower-voltage terminal $V_{low}$ and higher-voltage terminal $V_{high}$ by switches S31A, S33A, causing a tripling of any voltage provided at lower-voltage terminal $V_{low}$, or conversely reducing any voltage provided at higher-voltage terminal $V_{high}$ by a factor of three. In second clock phase $\Phi_2$ of first clock $\Phi$ in the charge pump formed by capacitors C30B, C31B and switches S30B, S31B, S32B, S33B, S34B and S35B, capacitors C30B, C31B are coupled in parallel with lower-voltage terminal $V_{low}$, by the activation of switches S30B, S32B, S34B and S35B, and in first clock phase $\Phi_1$ of first clock Φ, in series between lower-voltage terminal $V_{low}$ and higher-voltage terminal $V_{high}$ by switches S31B and S33B, so that the two parallel charge pump states operated in an out-of-phase fashion according to first clock Φ. The common coupling of capacitors C30B and C31B by switches S34B and S30B, is also coupled to higher-voltage terminal $V_{high}$ in first clock phase $Φ_1$ of first clock Φ during time intervals in which phase $ψ_1$ of second clock ψ is asserted. Thus, as in charge pump circuit 14A of FIG. 2A and FIG. 2B, the pair of dual charge pumps in charge pump circuit 14B, and operate in a similar manner, in that the connection of phases $Φ_1$, $Φ_2$ of first clock Φ are reversed for the switch functions as between the two charge pump stages. Therefore, charge pump circuit 14B consists of two 3:1 charge pump stages operating out of phase with each other, with respect to the charge pump operating clock, i.e., first clock Φ, that controls whether each charge pump stage is in the charging or tripling condition. While charge pump circuit 14A illustrates a doubling charge pump circuit and charge pump circuit 14B illustrates a tripling charge pump circuit, it is understood that controlling and/or varying the phase relationship between relationship between first clock Φ and second clock ψ may be used to control the voltage transfer ratio of any configuration of charge pump, including other multiplication or division factors, and other topologies, such as inverted topologies that intermittently connect higher-voltage terminal $V_{high}$ to ground, to lower-voltage terminal $V_{low}$, and/or to any of the storage capacitors within a charge pump circuit that store multiples or fractions of the input voltage. In general, higher-voltage terminal $V_{high}$ may be intermittently connected to any of the voltage levels within the charge pump circuit, which provides flexibility in control of the voltage transfer ratio of the overall switched-power circuit, lending application of the techniques disclosed herein to systems such as audio amplifiers, as described in examples set forth below in accordance with embodiments of the disclosure.

Figure 5A:
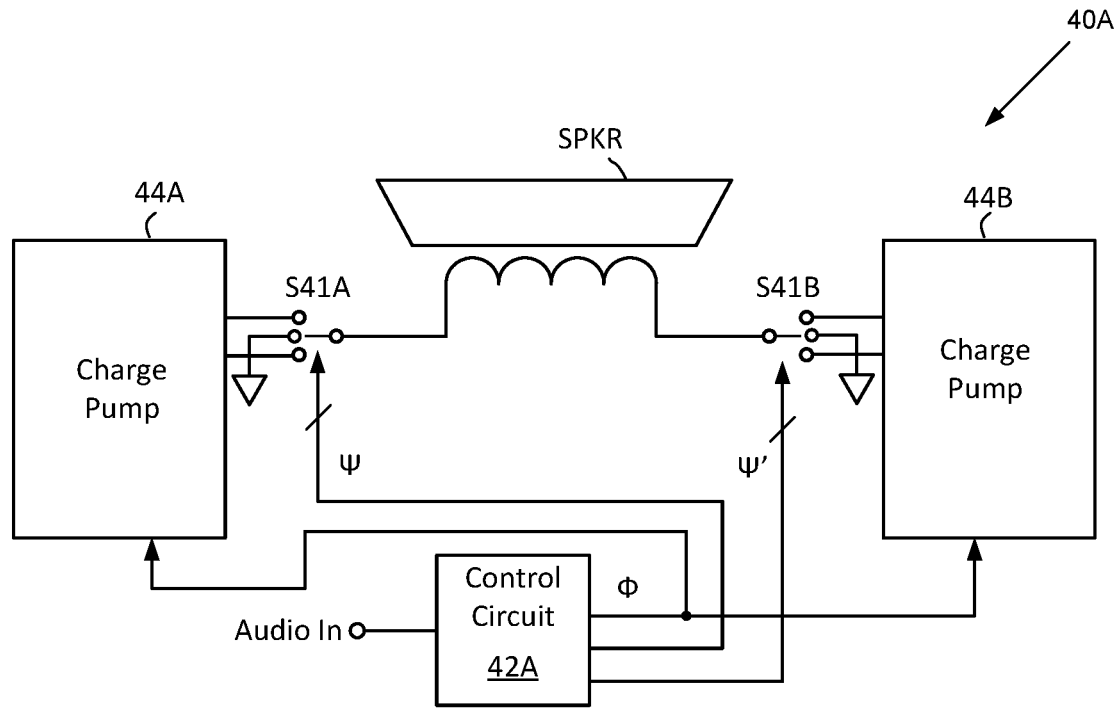
FIGS. 5A-5B are block diagrams illustrating example switched-power amplifiers 40A-40B, respectively, in accordance with embodiments of the disclosure.

Referring now to FIG. 5A, a block diagram illustrating an example switched-power amplifier 40A is shown, in accordance with an embodiment of the disclosure. Since the phase relationship between first clock Φ and second clock ψ may be used to set the voltage conversion ratio in the cascaded power supply circuits described above, with sufficient oversampling, the same mechanism may be used to generate a power amplifier output, e.g., for an audio reproduction system. In place of an inductor-based power supply circuit, a first terminal of an inductive load in the form of a speaker SPKR is coupled to the output of a charge pump circuit 4A by a switch S41A, and a second terminal of speaker SPKR is coupled to another charge pump circuit 4B by another switch S41B. A control circuit 42A receives an audio input signal Audio In and generates phases of first clock Φ to control charge pumps 4A, 4B and also phases of second clock ψ and another second clock ψ' that have separately controlled phase relationships with first clock signal Φ. Charge pumps 4A, 4B have dual charge pump stages coupled in parallel and operated by complementary phases of first clock Φ as in the charge pump circuits described above. The depicted example switched-power amplifier 40A may be operated as a bridge amplifier, with second clock ψ and other second clock ψ' separately controllable to provide a power output signal corresponding to an amplified version of audio input signal Audio In Each of switches S41A and S41B include the two coupling positions illustrated above as controlled by second clock ψ and a third position, shown as coupled to ground, but which may be another static return/voltage reference that permits operation without requiring speaker SPKR to reproduce ripple at the output of charge pumps 44A, 44B and so that any voltage in the range of the outputs of charge pumps may be reproduced by modulating the phase differences between first clock Φ and the two second clocks ψ, ψ' and alternatively selecting ground at one or both terminals of speaker SPKR as needed to obtain the desired output voltage waveform. In general, the number of voltage accessible to switches S41A and S41B may be expanded to encompass any number of levels to provide the amplified signals, including inverted multiples of the charge pump input voltage, e.g., { ... −4×, −3×, −2×, −1×, 1×, 2×, 3×, 4× ... }, which in combination with the control of the phase differences between first clock Φ and a corresponding number of second clocks {ψ, ψ', ψ'', ... } allows for efficient generation of the audio output waveform across a wide range of amplitudes and/or input voltages.

Figure 5B:
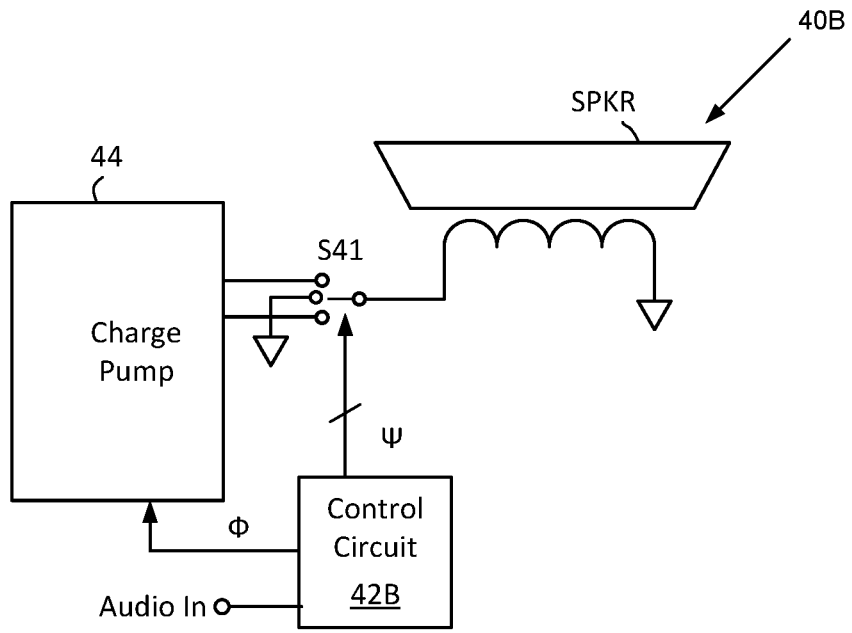

Referring now to FIG. 5B, a block diagram illustrating another example switched-power amplifier 40B is shown, in accordance with another embodiment of the disclosure. Switched-power amplifier 40B is similar to switched-power amplifier 40A of FIG. 5A, so only differences between them will be described below. Rather than a bridge configuration, example switched-power amplifier 40B is an example of a single-ended configuration, and includes a single charge pump circuit 44 coupled to speaker SPKR by a single three-position switch S41 that alternatively selects the charge pump stages of a dual charge pump within charge pump circuit 44, or ground, as needed to generate the desired audio output signal.

Figure 6A:
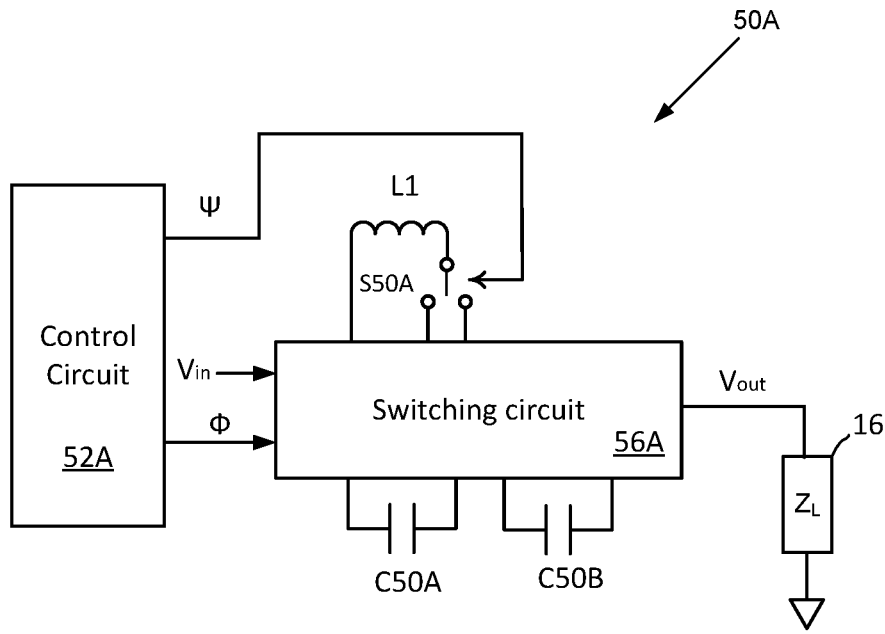
FIG. 6A is a simplified schematic diagram illustrating an example switched-power converter 50A, in accordance with embodiments of the disclosure

Referring now to FIG. 6A a simplified schematic diagram illustrating an example switched-power converter 50A is shown, in accordance with embodiments of the disclosure. A control circuit 52A generates phases of first clock Φ and second clock ψ, and a switching circuit 56A implements the switches needed to configure capacitors C50A and C50B to form the dual charge pump circuit described above. Control circuit 52A and switching circuit 56A may be incorporated in an integrated circuit (IC) that provides terminals for connection of capacitors C50A and C50B and an inductor L. A switch S50A that selects application of the inductor current through inductor L1 to or from capacitor C50A and C50B may be internal to, or external to the IC. Output voltage $V_{out}$ is provided from switching circuit 56A is connected to load 16, and input voltage $V_{in}$ is provided to switching circuit 56A. The depicted arrangement may be used to implement, for example, any of the cascaded switched-power converters described above.

Figure 6B:
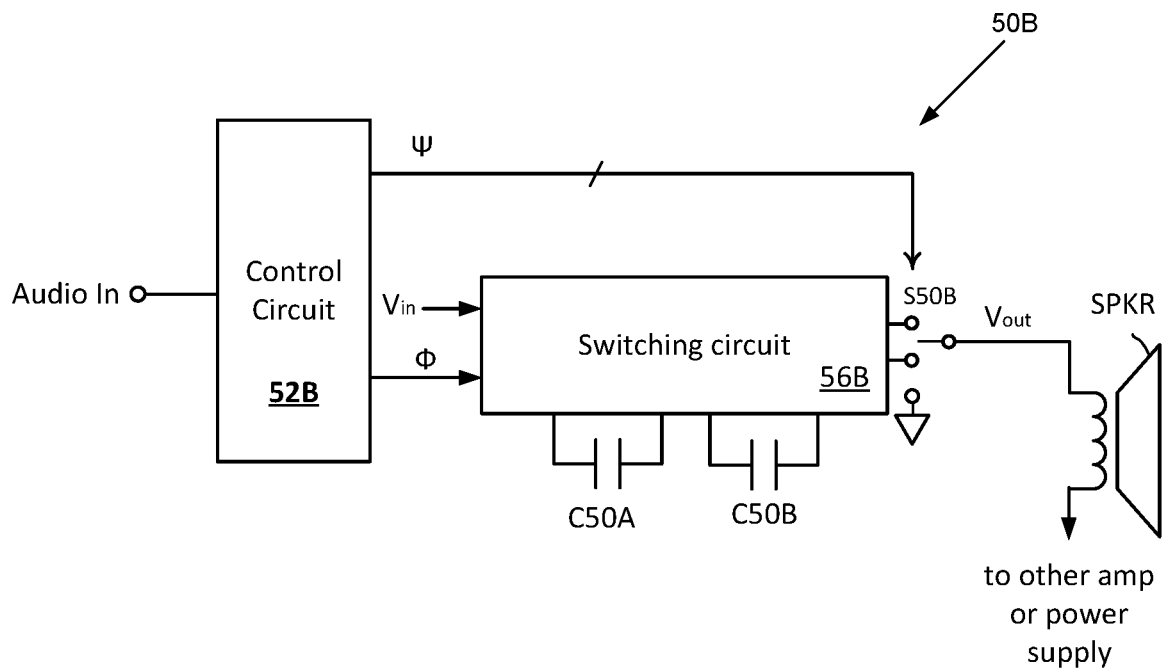
FIG. 6B is a simplified schematic diagram illustrating an example switched-power amplifier 50B, in accordance with embodiments of the disclosure.

Referring now to FIG. 6B, a simplified schematic diagram illustrating an example switched-power amplifier 50B is shown, in accordance with embodiments of the disclosure. Example switched-power amplifier 50B is similar to example switched-power converter 50A of FIG. 6A, so only differences between them will be described below. In switched-power amplifier 50B, inductor L and load 16 are removed and speaker SPKR serves as the inductive element and the load. A control circuit 52B receives audio input signal Audio In and generates first clock Φ and second clock ψ with a phase difference modulated with the audio to generate a power output signal by application of the charge pump output voltages to speaker SPKR by a switch S50B that is controlled by second clock ψ including additional states that select connection of speaker SPKR to ground or another voltage return/reference in order to produce the full range of audio signal required.

In summary, this disclosure shows and describes circuits, methods of operation, and integrated circuits implementing a cascaded switched power converter. In some example embodiments, the circuit may be a circuit for delivering power to a load, and may include a first terminal for receiving an input voltage or current, a switched-capacitor charge pump circuit operated by one or more first clock signals, and including at least two storage capacitors, and an inductor-based power supply circuit. The switched-capacitor charge pump circuit may be coupled in cascade with the inductor-based power supply circuit between the first terminal and a second terminal according to one or more second clock signals. The circuit also includes a control circuit that generates the one or more first clock signals and the one or more second clock signals so that the one or more second clock signals have a phase offset with respect to the one or more first clock signals that is set to adjust a conversion ratio of the cascaded combination of the switched-capacitor charge pump circuit and the inductor-based power supply circuit. The circuit may operate according to a method of delivering power to a load, that includes receiving an input voltage or current at the input terminal, operating the switched-capacitor charge pump circuit according to the one or more first clock signals to charge at least two storage capacitors of the switched-capacitor charge pump circuit in different phases of the one or more first clock signals, and operating the inductor-based power supply circuit in cascade with the switched-capacitor charge pump circuit between the input terminal and an output terminal according to the one or more second clock signals.

In some example embodiments, the switched-capacitor charge pump circuit may include at least two switches, respectively controlled by separate phases of the second clock signal, to apply or receive inductor current in alternation to or from the at least two storage capacitors of the switched-capacitor charge pump circuit. In some example embodiments, the switched-capacitor charge pump circuit may include a first charge pump circuit including a first capacitor of the at least two storage capacitors and a first plurality of switches separate from the at least two switches and operated by first phases of the one or more first clock signals, and a second charge pump circuit coupled in parallel with the first charge pump circuit and including a second capacitor of the at least two storage capacitors. The second charge pump circuit may further include a second plurality of switches separate from the at least two switches and operated by second phases of the one or more first clock signals that are complementary with the first phases of the one or more first clock signals, so that the second charge pump circuit operates in an opposite phase from the first charge pump circuit with respect to the one or more first clock signals. In some example embodiments, the first charge pump circuit may further include at least one third capacitor coupled to the first capacitor by at least one switch of the first plurality of switches, and the second charge pump circuit may further include at least one fourth capacitor coupled to the second capacitor by at least one switch of the first plurality of switches.

In some example embodiments, a duty cycle of the one or more first clock signals and a duty cycle of the one or more second clock signals may be in a range between 40 and 60 percent. In some example embodiments, the first terminal may be an input terminal that supplies a connection to a DC input voltage source through an external inductance, and the at least two switches of the switched-capacitor charge pump circuit may direct current from the external inductance to provide input current to the switched-capacitor charge pump circuit. The switched-capacitor charge pump circuit may have an output coupled to the second terminal to deliver the power to the load. In some example embodiments, the circuit is a power supply for providing power supply voltages to another electronic circuit. In some example embodiments, the first terminal may be coupled to an input of the charge pump, and an output of the charge pump may be coupled to an input of the inductor-based power supply circuit. The output of the inductor-based power supply circuit may have an output coupled to the second terminal to deliver the power to the load. In some example embodiments, in a first operating mode, the cascaded combination of the switched-capacitor charge pump circuit and the inductor-based power supply circuit may transfer energy from the first terminal to the second terminal, and in a second operating mode, the cascaded combination of the switched-capacitor charge pump circuit and the inductor-based power supply circuit may transfer energy from the second terminal to the first terminal. In some example embodiments, the first terminal may be coupled to a battery that is discharged through the circuit to the second terminal in the first operating mode, and the circuit may charge the battery from an energy source coupled to the second terminal in the second operating mode.

In other example embodiments, the circuit is a circuit for delivering power to an inductive load, and includes a first terminal for receiving an input voltage or current, a switched-capacitor charge pump circuit operated by one or more first clock signals, including at least two storage capacitors, and at least two switches respectively controlled by separate phases of a second clock signal to apply current in alternation from the at least two storage capacitors of the switched-capacitor charge pump circuit to the inductive load. The circuit also includes a control circuit that generates the one or more first clock signals and the second clock signal so that the second clock signal has a phase offset with respect to the one or more first clock signals that is set to adjust a conversion ratio of the circuit. The circuit may operate according to a method of delivering power to the inductive load, that includes receiving an input voltage or current at the first terminal, operating the switched-capacitor charge pump circuit according to the one or more first clock signals to charge the at least two storage capacitors of the switched-capacitor charge pump circuit in different phases of the one or more clock signals, operating the switched-capacitor charge pump circuit according to the one or more second clock signals to direct charge from the at least two storage capacitors to apply current in alternation from the at least two storage capacitors of the switched-capacitor charge pump circuit to the load, and generating the one or more first clock signals and the one or more second clock signals so that the one or more second clock signals have the phase offset with respect to the one or more first clock signals set to adjust a conversion ratio of the circuit.

In some example embodiments, the inductive load may be a speaker, and the control circuit may control the phase offset according to an audio signal representation, so that the circuit may implement an audio power amplifier. In some example embodiments, the at least two switches may include a pair of switches that intermittently couple a first terminal of the speaker to the at least two storage capacitors and a third switch that intermittently couples the first terminal of the speaker to a return voltage. In some example embodiments, the switched-capacitor charge pump circuit may be a first switched-capacitor charge pump circuit that implements a first side of a bridged audio power amplifier having an output coupled to the first terminal of the speaker, and the circuit may further include a second charge pump circuit that implements a second side of the bridged audio power amplifier and having an output coupled to a second terminal of the speaker. In some example embodiments, the switched-capacitor charge pump circuit may have an output coupled to a first terminal of the speaker, and the second terminal of the speaker may be coupled to a return terminal.

While the disclosure has shown and described particular embodiments of the techniques disclosed herein, it will be understood by those skilled in the art that the foregoing and other changes in form, and details may be made therein without departing from the spirit and scope of the disclosure. For example, the techniques shown above may be applied to a control system for supplying signals to a motor or haptic device.

What is claimed is:

1. A circuit for delivering power to a load, the circuit comprising:
   a first terminal for receiving an input voltage or current;
   a switched-capacitor charge pump circuit operated by one or more first clock signals, and comprising at least two storage capacitors;
   an inductor-based power supply circuit, wherein the switched-capacitor charge pump circuit is coupled in cascade with the inductor-based power supply circuit between the first terminal and a second terminal according to one or more second clock signals; and
   a control circuit that generates the one or more first clock signals and the one or more second clock signals so that the one or more second clock signals have a phase offset with respect to the one or more first clock signals that is set to adjust a conversion ratio of the cascaded combination of the switched-capacitor charge pump circuit and the inductor-based power supply circuit.

2. The circuit of claim 1, wherein the switched-capacitor charge pump circuit comprises at least two switches, respectively controlled by separate phases of the second clock signal, to apply or receive inductor current in alternation to or from the at least two storage capacitors of the switched-capacitor charge pump circuit.

3. The circuit of claim 2, wherein the switched-capacitor charge pump circuit comprises:
   a first charge pump circuit comprising a first capacitor of the at least two storage capacitors and a first plurality of switches separate from the at least two switches and operated by first phases of the one or more first clock signals; and
   a second charge pump circuit coupled in parallel with the first charge pump circuit and comprising a second capacitor of the at least two storage capacitors, wherein the second charge pump circuit further comprises a second plurality of switches separate from the at least two switches and operated by second phases of the one or more first clock signals that are complementary with the first phases of the one or more first clock signals, so that the second charge pump circuit operates in an opposite phase from the first charge pump circuit with respect to the one or more first clock signals.

4. The circuit of claim 3, wherein the first charge pump circuit further comprises at least one third capacitor coupled to the first capacitor by at least one switch of the first plurality of switches, and wherein the second charge pump circuit further comprises at least one fourth capacitor coupled to the second capacitor by at least one switch of the first plurality of switches.

5. The circuit of claim 2, wherein a duty cycle of the one or more first clock signals and a duty cycle of the one or more second clock signals are in a range between 40 and 60 percent.

6. The circuit of claim 2, wherein the first terminal is an input terminal that supplies a connection to a DC input voltage source through an external inductance, wherein the at least two switches of the switched-capacitor charge pump circuit direct current from the external inductance to provide input current to the switched-capacitor charge pump circuit, and wherein the switched-capacitor charge pump circuit has an output coupled to the second terminal to deliver the power to the load.

7. The circuit of claim 1, wherein the circuit is a power supply for providing power supply voltages to another electronic circuit.

8. The circuit of claim 1, wherein the first terminal is coupled to an input of the charge pump, and wherein an output of the charge pump is coupled to an input of the inductor-based power supply circuit, and wherein the output of the inductor-based power supply circuit has an output coupled to the second terminal to deliver the power to the load.

9. The circuit of claim 8, wherein in a first operating mode, the cascaded combination of the switched-capacitor charge pump circuit and the inductor-based power supply circuit transfers energy from the first terminal to the second terminal, and wherein in a second operating mode, the cascaded combination of the switched-capacitor charge pump circuit and the inductor-based power supply circuit transfers energy from the second terminal to the first terminal.

10. The circuit of claim 9, wherein the first terminal is coupled to a battery that is discharged through the circuit to the second terminal in the first operating mode, and wherein the circuit charges the battery from an energy source coupled to the second terminal in the second operating mode.

11. A circuit for delivering power to an inductive load, the circuit comprising:
    a first terminal for receiving an input voltage or current;
    a switched-capacitor charge pump circuit operated by one or more first clock signals, comprising at least two storage capacitors, and further comprising at least two switches respectively controlled by separate phases of a second clock signal to apply current in alternation from the at least two storage capacitors of the switched-capacitor charge pump circuit to the inductive load; and
    a control circuit that generates the one or more first clock signals and the second clock signal so that the second clock signal has a phase offset with respect to the one or more first clock signals that is set to adjust a conversion ratio of the circuit.

12. The circuit of claim 11, wherein the switched-capacitor charge pump circuit comprises:
    a first charge pump circuit comprising a first capacitor of the at least two storage capacitors and a first plurality of switches separate from the at least two switches and operated by first phases of the one or more first clock signals; and
    a second charge pump circuit coupled in parallel with the first charge pump circuit and comprising a second capacitor of the at least two storage capacitors, wherein the second charge pump circuit further comprises a second plurality of switches separate from the at least two switches and operated by second phases of the one or more first clock signals that are complementary with the first phases of the one or more first clock signals, so that the second charge pump circuit operates in an opposite phase from the first charge pump circuit with respect to the one or more first clock signals.

13. The circuit of claim 12, wherein the first charge pump circuit further comprises at least one third capacitor coupled to the first capacitor by at least one switch of the first plurality of switches, and wherein the second charge pump circuit further comprises at least one fourth capacitor coupled to the second capacitor by at least one switch of the first plurality of switches.

14. The circuit of claim 11, wherein the inductive load is a speaker and wherein the control circuit controls the phase offset according to an audio signal representation, whereby the circuit implements an audio power amplifier.

15. The circuit of claim 14, wherein the at least two switches include a pair of switches that intermittently couple a first terminal of the speaker to the at least two storage capacitors and a third switch that intermittently couples the first terminal of the speaker to a return voltage.

16. The circuit of claim 14, wherein the switched-capacitor charge pump circuit is a first switched-capacitor charge pump circuit that implements a first side of a bridged audio power amplifier having an output coupled to the first terminal of the speaker, and wherein the circuit further comprises a second charge pump circuit that implements a second side of the bridged audio power amplifier and having an output coupled to a second terminal of the speaker.

17. The circuit of claim 14, wherein the switched-capacitor charge pump circuit has an output coupled to a first terminal of the speaker, and wherein the second terminal of the speaker is coupled to a return terminal.

18. A method of delivering power to a load, comprising:
receiving an input voltage or current at an input terminal of a power supply circuit;
operating a switched-capacitor charge pump circuit according to one or more first clock signals to charge at least two storage capacitors of the switched-capacitor charge pump circuit in different phases of the one or more first clock signals; and
operating an inductor-based power supply circuit in cascade with the switched-capacitor charge pump circuit between the input terminal and an output terminal according to one or more second clock signals, wherein the one or more second clock signals have a phase offset with respect to the one or more first clock signals that is set to adjust a conversion ratio of the power delivery system.

19. The method of claim 18, wherein the switched-capacitor charge pump circuit comprises at least two switches, and wherein the method further comprises controlling the at least two switches with separate phases of the one or more second clock signals to apply or receive inductor current in alternation between the at least two storage capacitors of the switched-capacitor charge pump circuit.

20. The method of claim 19, wherein the switched-capacitor charge pump circuit comprises a pair of charge pump circuits coupled in parallel and operating in opposite phase with respect to the one or more first clock signals.

21. The method of claim 18, wherein a duty cycle of the one or more first clock signals and a duty cycle of the one or more second clock signals are in a range between 40 and 60 percent.

22. The method of claim 19, wherein the input terminal is a terminal that supplies a connection to a DC input voltage source through an external inductance, wherein the operating the switched-capacitor charge pump circuit operates the at least two switches of the switched-capacitor charge pump circuit to direct current from the external inductance to provide input current to the switched-capacitor charge pump circuit, and wherein the switched-capacitor charge pump circuit has an output coupled to the output terminal to deliver the power to the load.

23. The method of claim 18, wherein the input terminal is coupled to an input of the switched-capacitor charge pump circuit, wherein an output of the charge pump is coupled to an input of the inductor-based power supply circuit, and wherein the output of the inductor-based power supply circuit has an output coupled to the output terminal to deliver the power to the load.

24. The method of claim 18, wherein the method further comprises:
selecting between a first operating mode and a second operating mode;
responsive to selecting the first operating mode, transferring energy from the first terminal to the second terminal by the cascaded combination of the switched-capacitor charge pump circuit and the inductor-based power supply circuit; and
responsive to selecting the second operating mode, transferring energy from the second terminal to the first terminal by the cascaded combination of the switched-capacitor charge pump circuit and the inductor-based power supply circuit.

25. The method of claim 24, wherein the first terminal is coupled to a battery that is discharged in the first operating mode and that is charged in the second operating mode.

26. A method of delivering power to an inductive load, comprising:
receiving an input voltage or current at a first terminal;
operating a switched-capacitor charge pump circuit according to one or more first clock signals to charge at least two storage capacitors of the switched-capacitor charge pump circuit in different phases of the one or more clock signals; and
operating the switched-capacitor charge pump circuit according to one or more second clock signals to direct charge from the at least two storage capacitors to apply current in alternation from the at least two storage capacitors of the switched-capacitor charge pump circuit to the load; and
generating the one or more first clock signals and the one or more second clock signals so that the one or more second clock signals have a phase offset with respect to the one or more first clock signals that is set to adjust a conversion ratio of the circuit.

27. The method of claim 26, wherein the switched-capacitor charge pump circuit comprises a pair of charge pump circuits coupled in parallel and operating in opposite phase with respect to the one or more first clock signals.

28. The method of claim 26, wherein the inductive load is a speaker and wherein the generating controls the phase offset according to an audio signal representation, whereby the method is a method of operation of an audio power amplifier.

29. The method of claim 28, wherein the one or more second clock signals operate a pair of switches that intermittently couple a first terminal of the speaker to the at least two storage capacitors and a third switch that intermittently couples the first terminal of the speaker to a return voltage.

30. The method of claim 28, wherein the switched-capacitor charge pump circuit is a first switched-capacitor charge pump circuit that implements a first side of a bridged audio power amplifier having an output coupled to the first terminal of the speaker, and wherein the method further comprises operating a second charge pump circuit that implements a second side of the bridged audio power amplifier and has an output coupled to a second terminal of the speaker.

31. The method of claim 28, wherein the switched-capacitor charge pump circuit has an output coupled to a first terminal of the speaker, and wherein the second terminal of the speaker is coupled to a return terminal.

* * * * *

UNITED STATES PATENT AND TRADEMARK OFFICE
CERTIFICATE OF CORRECTION

PATENT NO. : 12,362,645 B2
APPLICATION NO. : 18/358263
DATED : July 15, 2025
INVENTOR(S) : Melanson et al.

Page 1 of 1

It is certified that error appears in the above-identified patent and that said Letters Patent is hereby corrected as shown below:

On the Title Page

Item (72), under "Inventors", in Column 1, Line 1, delete "John L Melanson," and insert -- John L. Melanson, --, therefor.

Item (57), under "Abstract", in Column 2, Line 2, delete "ins" and insert -- in --, therefor.

In the Specification

In Column 2, Line 49, delete "disclosure" and insert -- disclosure. --, therefor.

In Column 2, Line 55, delete "disclosure" and insert -- disclosure. --, therefor.

In Column 3, Line 33, delete "$V_{out}$" and insert -- $V_{out.}$ --, therefor.

In Column 7, Line 48, delete "4A" and insert -- 44A --, therefor.

In Column 7, Line 50, delete "4B" and insert -- 44B --, therefor.

In Column 7, Line 53, delete "4A, 4B" and insert -- 44A, 44B --, therefor.

In Column 7, Line 56, delete "4A, 4B" and insert -- 44A, 44B --, therefor.

In Column 7, Line 63, delete "In Each" and insert -- In. Each --, therefor.

In Column 8, Line 39, delete "L." and insert -- L1. --, therefor.

Signed and Sealed this
Twenty-eighth Day of October, 2025

John A. Squires
*Director of the United States Patent and Trademark Office*